United States Patent
Wuu et al.

(10) Patent No.: US 11,869,874 B2
(45) Date of Patent: Jan. 9, 2024

(54) STACKED DIE CIRCUIT ROUTING SYSTEM AND METHOD

(71) Applicant: ADVANCED MICRO DEVICES, INC., Santa Clara, CA (US)

(72) Inventors: John Wuu, Fort Collins, CO (US); David Johnson, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 258 days.

(21) Appl. No.: 17/121,039

(22) Filed: Dec. 14, 2020

(65) Prior Publication Data

US 2022/0189921 A1 Jun. 16, 2022

(51) Int. Cl.
| | |
|---|---|
| H01L 25/065 | (2023.01) |
| H01L 25/18 | (2023.01) |
| H01L 23/00 | (2006.01) |
| H02M 3/04 | (2006.01) |
| H03K 19/20 | (2006.01) |

(52) U.S. Cl.
CPC .......... H01L 25/0657 (2013.01); H01L 24/08 (2013.01); H01L 25/18 (2013.01); H02M 3/04 (2013.01); H03K 19/20 (2013.01); H01L 2224/08146 (2013.01); H01L 2225/06517 (2013.01); H01L 2225/06541 (2013.01); H01L 2225/06565 (2013.01)

(58) Field of Classification Search
CPC ...... H01L 25/0657; H01L 25/18; H01L 24/08
See application file for complete search history.

(56) References Cited

U.S. PATENT DOCUMENTS

| | | | |
|---|---|---|---|
| 9,508,701 B2 | 11/2016 | Reber et al. | |
| 10,797,037 B1* | 10/2020 | Lin | H01L 25/0657 |
| 10,804,255 B1* | 10/2020 | Agarwal | H03K 3/037 |
| 11,374,564 B1* | 6/2022 | Dubey | H01L 23/5286 |
| 11,398,469 B1* | 7/2022 | Karp | H01L 23/647 |
| 2010/0225002 A1* | 9/2010 | Law | H01L 23/481 |
| | | | 257/E21.597 |
| 2015/0243643 A1* | 8/2015 | Li | H01L 25/50 |
| | | | 438/109 |
| 2018/0277517 A1* | 9/2018 | Kim | H10B 61/22 |
| 2019/0259702 A1* | 8/2019 | Jain | C12Q 1/6886 |
| 2020/0168595 A1* | 5/2020 | Chang | H01L 25/0657 |
| 2020/0181407 A1* | 6/2020 | DeVoto | H01L 24/29 |
| 2020/0211930 A1* | 7/2020 | Wang | H01L 24/45 |
| 2020/0303311 A1* | 9/2020 | Young | H01L 25/50 |
| 2021/0159212 A1* | 5/2021 | Jing | H01L 25/0652 |
| 2021/0217729 A1* | 7/2021 | Kandala | H01L 23/528 |

(Continued)

OTHER PUBLICATIONS

U.S. Appl. No. 16/586,309 to Wuu, J. entitled "Scheme for Enabling Die Reuse in 3D Stacked Products", filed Sep. 27, 2019, 25 pages.

*Primary Examiner* — Nathan W Ha

(57) ABSTRACT

A stacked die system includes at least three dies. A first die has a same design as a second die. The first die includes a first circuit, and the second die includes a corresponding second circuit. A signal is received at the first die and sent to the third die via the second die. The signal is routed through either the first circuit or the second circuit but not both. Accordingly, an operation is performed on the signal prior to the signal reaching the third die but the operation is not performed by both the first circuit and the second circuit.

20 Claims, 9 Drawing Sheets

(56) References Cited

U.S. PATENT DOCUMENTS

| | | | |
|---|---|---|---|
| 2021/0391302 A1* | 12/2021 | Kao | H01L 24/08 |
| 2022/0137843 A1* | 5/2022 | Vogelsang | G11C 11/40611 |
| | | | 711/106 |
| 2022/0181256 A1* | 6/2022 | Gomes | H01L 25/18 |
| 2022/0181302 A1* | 6/2022 | Park | G11C 11/40626 |
| 2022/0208295 A1* | 6/2022 | Chueh | H01L 24/14 |
| 2022/0352092 A1* | 11/2022 | Chang | H01L 24/80 |
| 2022/0367415 A1* | 11/2022 | Huang | H01L 24/80 |
| 2022/0415837 A1* | 12/2022 | Jun | H01L 24/08 |
| 2023/0055425 A1* | 2/2023 | Jensen | H01L 25/0657 |
| 2023/0069315 A1* | 3/2023 | Chang | H01L 25/0657 |

\* cited by examiner

STACKED DIE CIRCUIT ROUTING SYSTEM AND METHOD

BACKGROUND

Electronic devices often utilize three-dimensional (3D) integrated circuit (IC) packaging to stack three or more dies in a package, which provides a smaller footprint compared to a single larger die or side-by-side die connected via an interposer. In some 3D IC packages, some dies include more timing-constrained circuits than other dies. However, in some cases, the available area on those dies is constrained by circuits where short communication times are desirable. Accordingly, in some cases it is desirable to move other circuits lacking such constraints, such as voltage regulation circuits, to other dies in the package, such as dies that are mostly vias such as through silicon vias (TSVs). However, in some cases, moving those circuits to another die causes that die to have a different design from another die in the package, even if those two dies otherwise have identical designs. In some cases, two dies having different designs results in fabrication of those dies using different masks, which is expensive.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
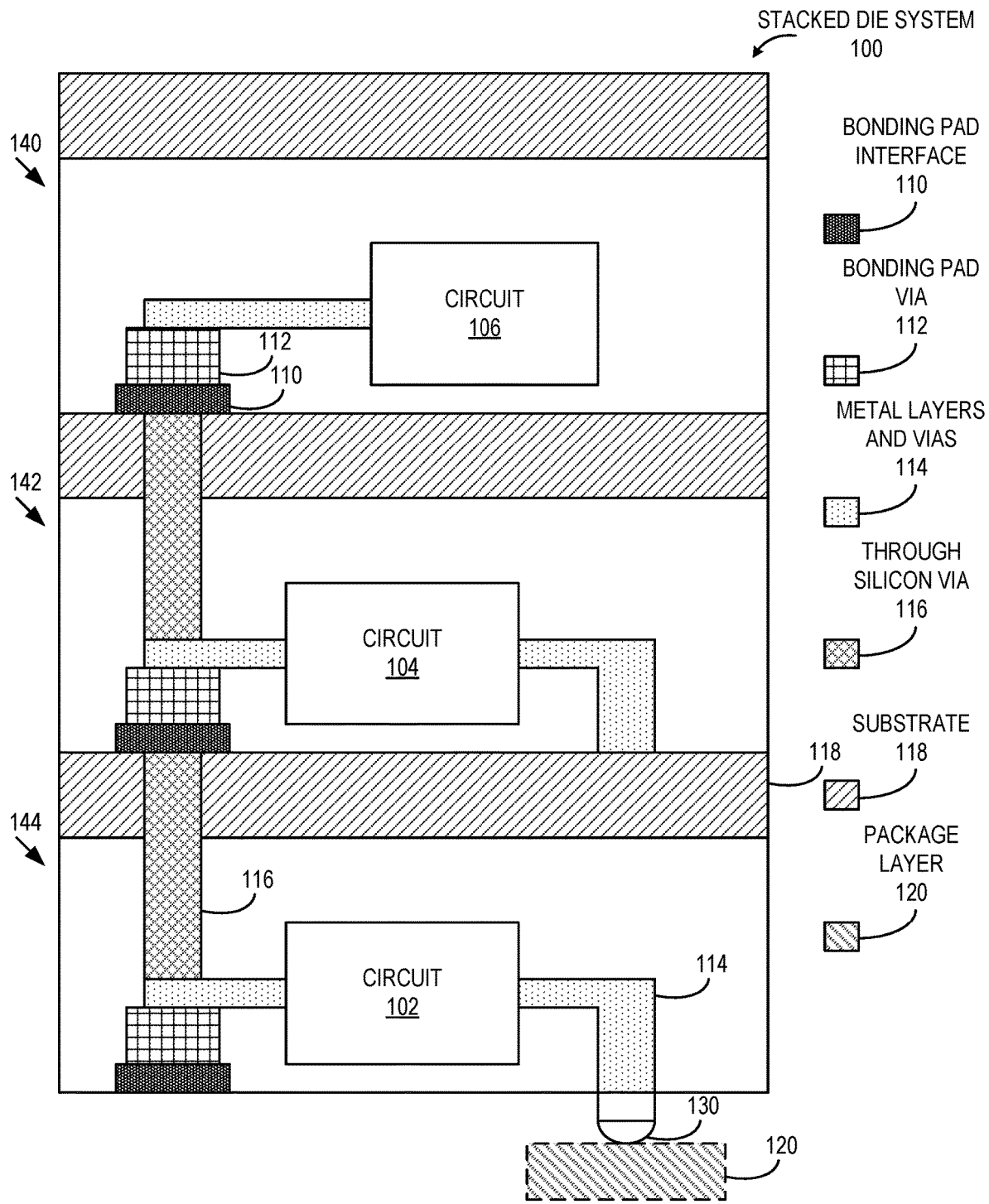
FIG. 1 is a block diagram of a first embodiment of a stacked die system in accordance with some embodiments.

A stacked die system includes at least three dies, where a second die is stacked overlying a first die and the third die is stacked overlying the second die. The second die has a same design as the first die. In some embodiments, as described herein, a signal is input at the first die and sent to the third die. On the way to the third die, the signal passes through a first circuit of the first die or a second circuit of the second die but not both. The circuit performs an operation using the signal, such as regulation of a voltage of the signal or a logical operation (e.g., inversion) using the signal. Accordingly, the operation is performed prior to the signal reaching the third die, allowing area of the third die to be used for other circuits at the expense of the first circuit and the second circuit using area within the first die and the second die, respectively, as compared to a stacked die system where a single circuit is located within the third die. Additionally, in some embodiments, a single mask is used to fabricate both the first die and the second die making fabrication cheaper as compared to a stacked die system where the first die and the second die are fabricated using different masks.

As used herein, two dies having a "same design" refers to the relative fabrication designs (e.g., masks) of the corresponding portions of the dies being the same. For example, two dies have a "same design" if a single mask could be used to create the corresponding portions of the dies even if variations due to fabrication or due to metals added after the mask is applied (e.g., bonding pads or bumps) are present.

As used herein, the terms "stacked vertically over" and "stacked overlying," which are used interchangeably herein, refer to the relative order of dies depicted in the figures. The terms "over" and "under" as used herein do not necessarily indicate that a component "over" another component is above that component as such directions and/or components can be flipped, rotated, moved in space, placed in a diagonal orientation or position, placed horizontally or vertically, or similarly modified. If, for example an, the orientation of stacked die system 100 of FIG. 1 were changed (e.g., flipped upside down or turned sideways), die 140 would still be considered to be "stacked vertically over" die 144. Similarly, if the orientation of stacked die system 100 of FIG. 1 were changed, die 140 would still be considered to be "stacked overlying" die 144. Additionally, "stacked vertically over" and "stacked overlying" are intended to be distinct from "stacked directly vertically over" and "stacked directly overlying," respectively. Accordingly, dies 140 and 142 are both "stacked vertically over" and "stacked overlying" die 144, but only die 142 is "stacked directly vertically over" and "stacked directly overlying" die 144.

FIGS. 1-6 are described below in a series pairs referring to various respective embodiments of a stacked die system. Within each pair of figures, one figure illustrates an example design, and the other figure illustrates one embodiment of the example design after fabrication where a signal path is also illustrated. These figures are meant to depict several illustrative examples and not to be exhaustive. Additionally, although some portions of the designs (e.g. bonding pads that are not connected to a metal layer of another die or metal bumps) are not included in the figures illustrating the signal paths, in some embodiments, those portions are still fabricated.

Figure 2:
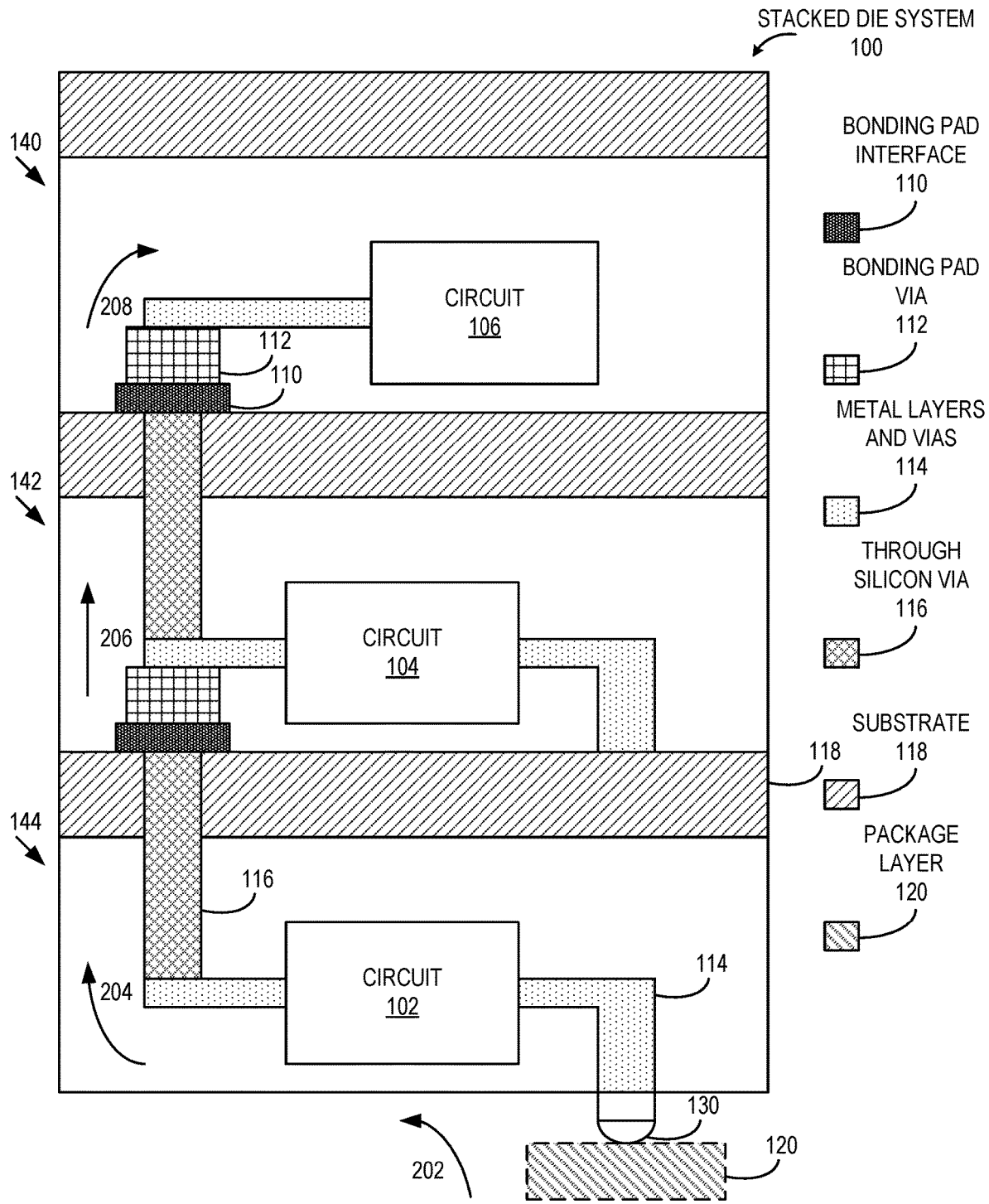
FIG. 2 is a block diagram of a signal route in a first embodiment of a stacked die system in accordance with some embodiments.

FIGS. 1 and 2 illustrate a front-to-back embodiment of a stacked die system 100 in accordance with at least some embodiments. Stacked die system 100 includes dies 140, 142, and 144, where die 140 is stacked vertically over dies 142 and 144 and die 142 is stacked vertically over die 144. As illustrated, dies 140-144 include some or all of the following layers: bonding pad interface 110, bonding pad via 112, metal layers and vias 114, through silicon via 116, and substrate 118. Substrates 118 are located at a side of dies 142 and 144 facing die 140, thus stacked die system 100 is a front-to-back embodiment. Further, die 140 includes circuit 106, die 142 includes circuit 104, and die 144 includes circuit 102. Additionally, stacked die system 100 includes bump 130, and in some embodiments, package layer 120. For clarity, other components such as some bumps, interposers, package substrates, diffusion regions, and active regions are not illustrated. In some embodiments, dies 140-144 are semiconductor dies. Additionally, in some embodiments, dies 140-144 are to be coupled to a printed circuit board (PCB) or other carrier for implementation in an electronic device, including, for example, a portable electronic device such as a cellular phone, tablet computer, or notebook computer, a desktop computer, a server, and the like.

In the illustrated embodiment, area in die 140 (e.g., a technology node) is more valuable than area in dies 142 and 144 (e.g., routing dies). Circuits 102 and 104 are formed from a plurality of metal layers and perform a function for circuit 106 of die 140. For example, in one embodiment, circuits 102 and 104 are voltage regulation circuits that control a voltage sent to die 140 in general, circuit 106 in particular, or both. As another example, circuits 102 and 104 are signal distribution circuits that perform logical operations such as inversion on the signal. In various embodiments, the logical operations are performed with or without the use of another signal (e.g., a signal that is logically ANDed to the signal). Accordingly, functionality for die 140 is moved to dies 142 and 144, enabling other circuits (e.g., portions of circuit 106) to occupy area of die 140.

As illustrated by FIG. 2, in the illustrated embodiment, a signal is received at die 144 via bump 130. As illustrated by arrow 202, the signal is routed through circuit 102. As illustrated by arrow 204, the signal is then routed to die 142. As illustrated by arrow 206, the signal is routed through die 142 to die 140 without being routed through circuit 104. As illustrated by arrow 208, the signal is routed to circuit 106. Accordingly, the signal is routed through circuit 102 but not circuit 104. As a result, power that would otherwise be consumed by circuit 104 operating on the signal is saved and potentially erroneous operation due to both circuit 102 and 104 operating on the signal is prevented.

Additionally, dies 142 and 144 have a same design. As a result, in the illustrated embodiment, dies 142 and 144 are fabricated using a same mask. In some cases, it is cheaper to fabricate dies 142 and 144, as compared to dies fabricated using different masks. As illustrated by FIG. 2, in some embodiments, some portions of stacked die system 100 are fabricated subsequent to using the mask, such as bonding pad interface 110, bonding pad via 112, and bumps. Accordingly, in some embodiments, some of those portions of stacked die system 100 are not formed, such as the bonding pad via 112 of die 144 opposite circuit 104 from through silicon via 116. In other embodiments, as illustrated by FIG. 1, some or all of those portions are formed.

In various embodiments, additional layers are used. For example, in some embodiments, the signal is received at bump 130 via package layer 120. Further, in some embodiments, various circuits or portions of circuits are located elsewhere within dies 140, 142, and 144. For example, in some embodiments, some or all of circuits 102 and 104 are located within respective substrates 118 of dies 142 and 144.

Figure 3:
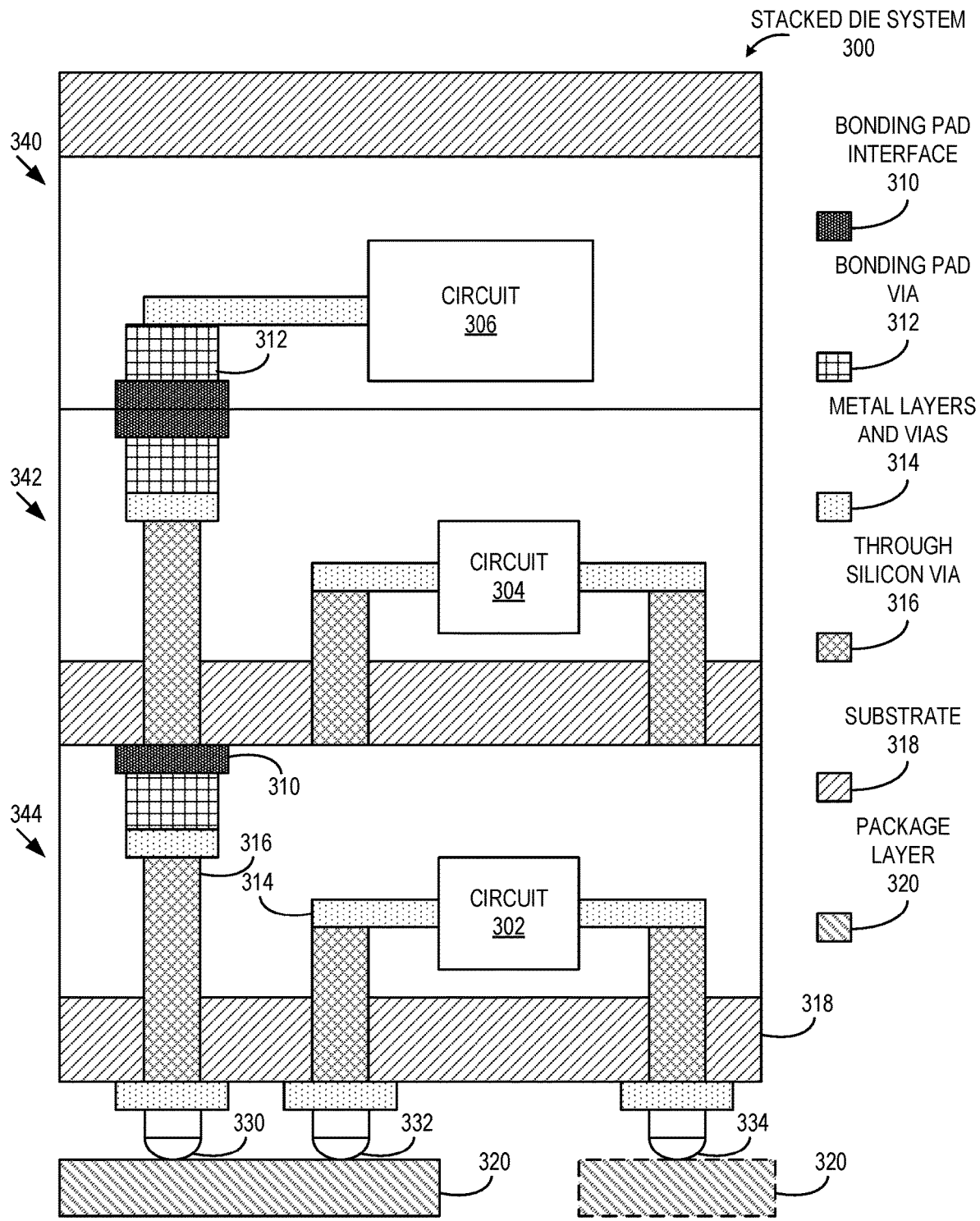
FIG. 3 is a block diagram of a second embodiment of a stacked die system in accordance with some embodiments.
Figure 4:
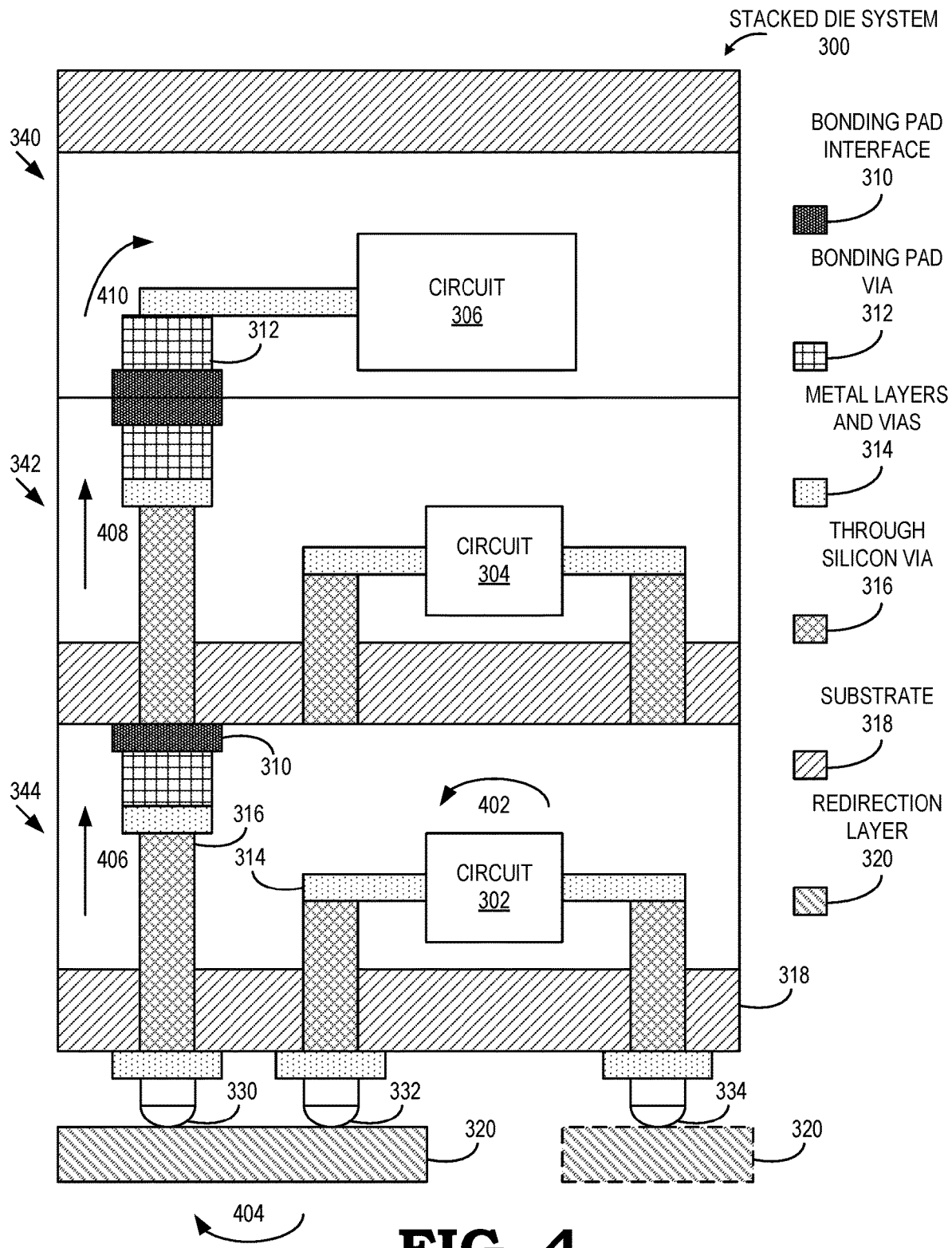
FIG. 4 is a block diagram of a signal route in a second embodiment of a stacked die system in accordance with some embodiments.

FIGS. 3 and 4 illustrate a first front-to-front embodiment of a stacked die system 300 in accordance with at least some embodiments. Stacked die system 300 includes dies 340, 342, and 344, where die 340 is stacked vertically over dies 342 and 344 and die 342 is stacked vertically over die 344. As illustrated, dies 340-344 include some or all of the following layers: bonding pad interface 310, bonding pad via 312, metal layers and vias 314, through silicon via 316, and substrate 318. Substrates 318 are located at a side of dies 342 and 344 facing away from die 340, thus stacked die system 300 is a front-to-front embodiment. Further, die 340 includes circuit 306, die 342 includes circuit 304, and die 344 includes circuit 302. Additionally, stacked die system 300 includes bumps 330, 332, 334, and package layer 320. In some embodiments, stacked die system 300 also includes another instance of package layer 320. Additionally, in some embodiments, the signal path of FIGS. 3 and 4 is implemented as a front-to-back stacked semiconductor device as described above with reference to FIGS. 1 and 2. For clarity, other components such as some bumps, interposers, package substrates, diffusion regions, and active regions are not illustrated. In some embodiments, dies 340-344 are semiconductor dies. Additionally, in some embodiments, dies 340-344 are to be coupled to a printed circuit board (PCB) or other carrier for implementation in an electronic device, including, for example, a portable electronic device such as a cellular phone, tablet computer, or notebook computer, a desktop computer, a server, and the like.

In the illustrated embodiment, similar to stacked die system 100 of FIGS. 1 and 2, area in die 340 (e.g., a technology node) is more valuable than area in dies 342 and 344 (e.g., routing dies). Circuits 302 and 304 are designed to perform a function for circuit 306 of die 340. For example, in one embodiment, circuits 302 and 304 are voltage regulation circuits that control a voltage sent to die 340 in general, circuit 306 in particular, or both. As another example, circuits 302 and 304 are signal distribution circuits that perform logical operations such as inversion on the signal. In various embodiments, the logical operations are performed with or without the use of another signal (e.g., a signal that is logically ANDed to the signal). Accordingly, functionality for die 340 is moved to dies 342 and 344, enabling other circuits (e.g., portions of circuit 306) to occupy area of die 340.

As illustrated by FIG. 4, in the illustrated embodiment, a signal is received at die 344 via bump 334. As illustrated by arrow 402, the signal is routed through circuit 302 to bump 332. As illustrated by arrow 404, the signal is routed through package layer 320 to bump 330. As illustrated by arrow 406, the signal is then routed through die 344 to die 342. As illustrated by arrow 408, the signal is routed through die 342 to die 340 without being routed through circuit 304. As illustrated by arrow 410, the signal is routed to circuit 306. Accordingly, the signal is routed through circuit 302 but not circuit 304. As a result, power that would otherwise be consumed by circuit 304 operating on the signal is saved and potentially erroneous operation due to both circuit 302 and 304 operating on the signal is prevented.

Additionally, dies 342 and 344 have a same design. As a result, in the illustrated embodiment, dies 342 and 344 are fabricated using a same mask. In some cases, it is cheaper to fabricate dies 342 and 344, as compared to dies fabricated using different masks. As illustrated by FIG. 4, in some embodiments, some portions of stacked die system 300 are fabricated subsequent to using the mask, such as bonding pad interface 310, bonding pad via 312, and bumps 330, 332, and 334. Accordingly, in some embodiments, some of those portions of stacked die system 300 are not formed. In other embodiments, some or all of those portions are formed.

In various embodiments, additional layers are used. For example, in some embodiments, the signal is received at bump 334 via package layer 320. Further, in some embodiments, various circuits or portions of circuits are located elsewhere within dies 340, 342, and 344. For example, in some embodiments, some or all of circuits 302 and 304 are located within respective substrates 318 of dies 342 and 344.

Figure 5:
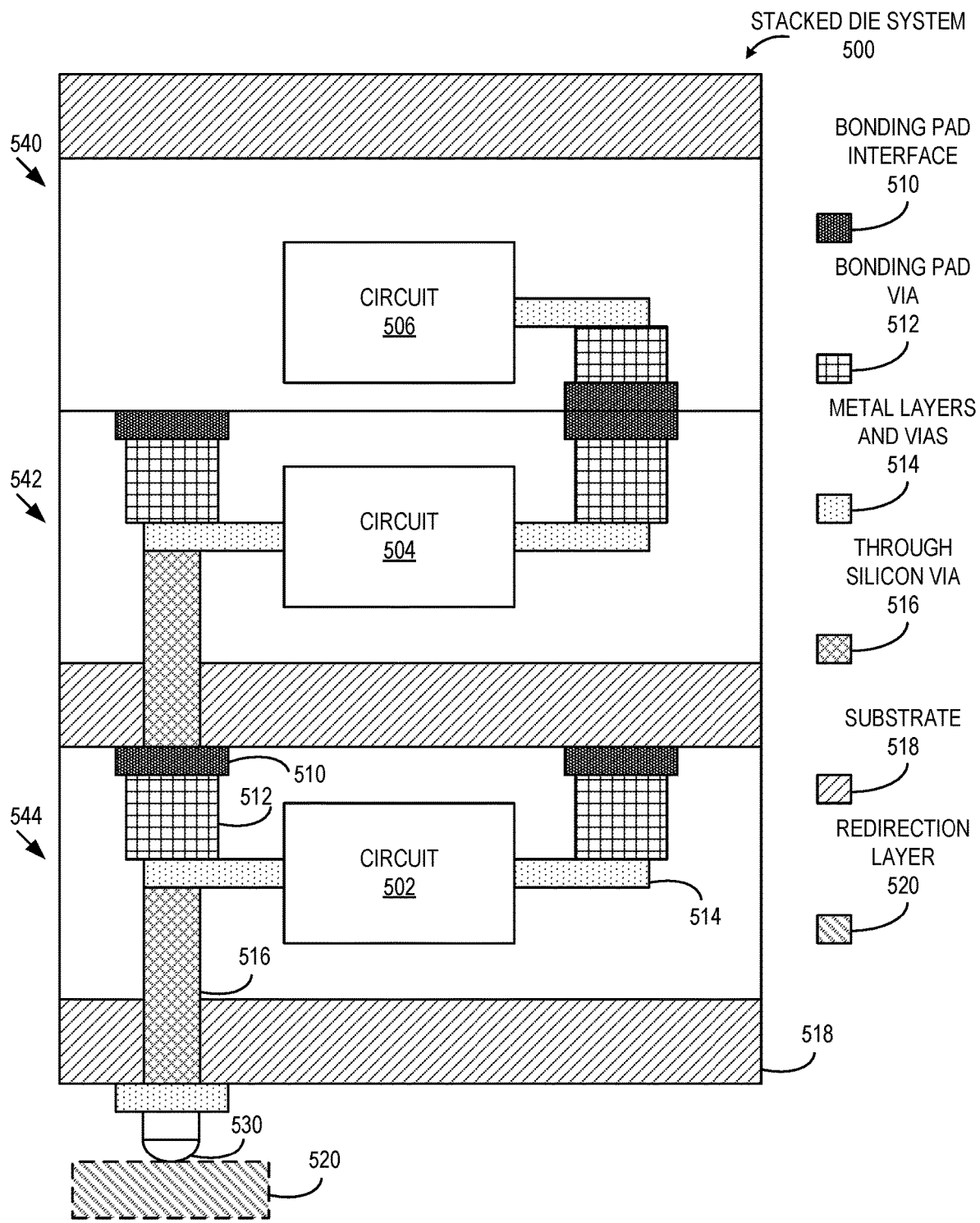
FIG. 5 is a block diagram of a third embodiment of a stacked die system in accordance with some embodiments.
Figure 6:
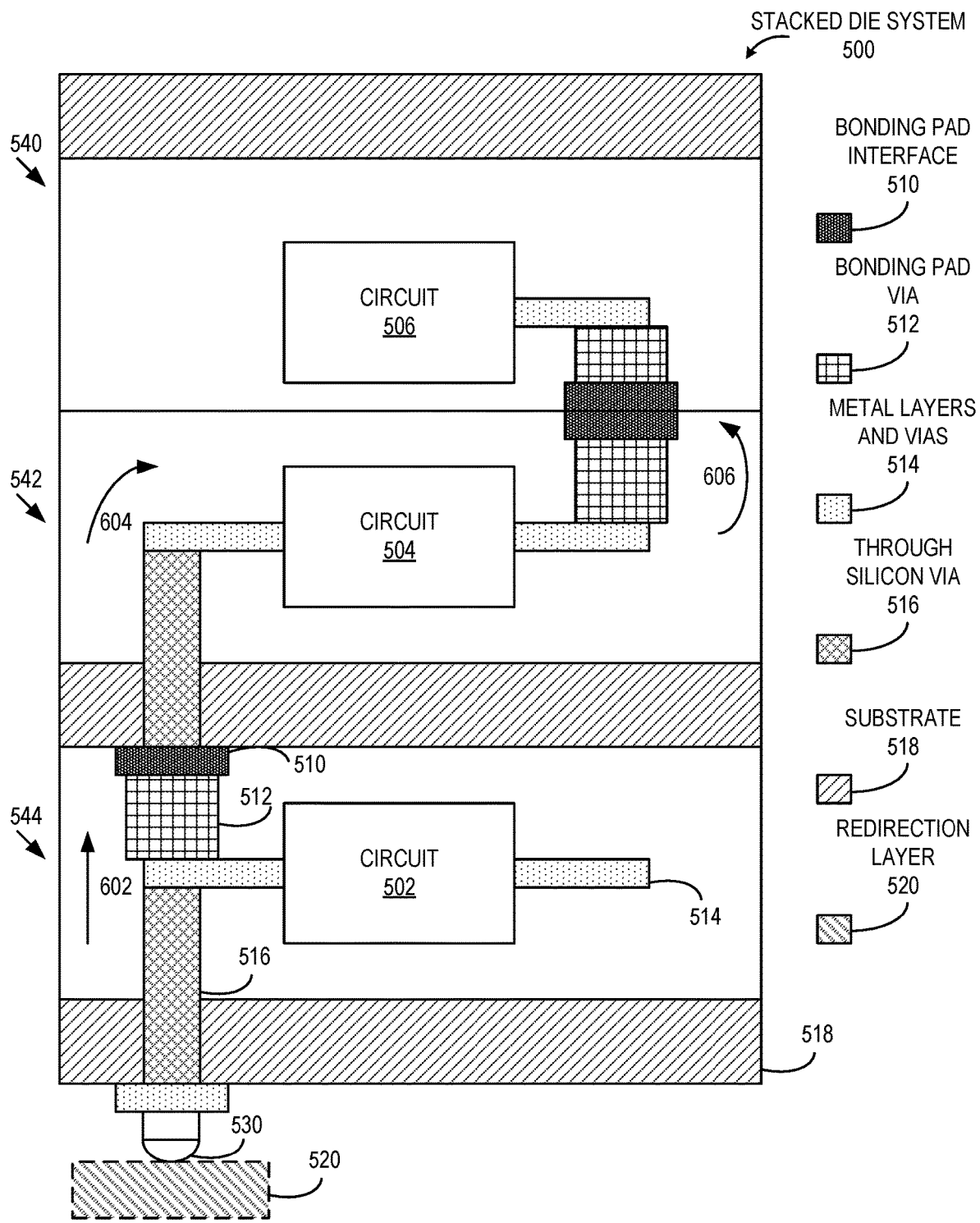
FIG. 6 is a block diagram of a signal route in a third embodiment of a stacked die system in accordance with some embodiments.

FIGS. 5 and 6 illustrate a second front-to-front embodiment of a stacked die system 500 in accordance with at least some embodiments. Stacked die system 500 includes dies 540, 542, and 544, where die 540 is stacked vertically over dies 542 and 544 and die 542 is stacked vertically over die 544. As illustrated, dies 540-544 include some or all of the following layers: bonding pad interface 510, bonding pad via 512, metal layers and vias 514, through silicon via 516, and substrate 518. Substrates 518 are located at a side of dies 542 and 544 facing away from die 540, thus stacked die system 500 is a front-to-front embodiment. Further, die 540 includes circuit 506, die 542 includes circuit 504, and die 544 includes circuit 502. Additionally, stacked die system 500 includes bump 530, and, in some embodiments, package layer 520. For clarity, other components such as some bumps, interposers, package substrates, diffusion regions, and active regions are not illustrated. In some embodiments, dies 540-544 are semiconductor dies. Additionally, in some embodiments, dies 540-544 are to be coupled to a printed circuit board (PCB) or other carrier for implementation in an electronic device, including, for example, a portable electronic device such as a cellular phone, tablet computer, or notebook computer, a desktop computer, a server, and the like.

In the illustrated embodiment, similar to stacked die system 100 of FIGS. 1 and 2, area in die 540 (e.g., a technology node) is more valuable than area in dies 542 and 544 (e.g., routing dies). Circuits 502 and 504 are designed to perform a function for circuit 506 of die 540. For example, in one embodiment, circuits 502 and 504 are voltage regulation circuits that control a voltage sent to die 540 in general, circuit 506 in particular, or both. As another example, circuits 502 and 504 are signal distribution circuits that perform logical operations such as inversion on the signal. In various embodiments, the logical operations are performed with or without the use of another signal (e.g., a signal that is logically ANDed to the signal). Accordingly, functionality for die 540 is moved to dies 542 and 544, enabling other circuits (e.g., portions of circuit 506) to occupy area of die 540.

As illustrated by FIG. 6, in the illustrated embodiment, a signal is received at die 544 via bump 530. As illustrated by arrow 602, the signal is routed through die 544 to die 542 without being routed through circuit 502. As illustrated by arrow 604, the signal is routed through circuit 504 to die 540. As illustrated by arrow 606, the signal is routed to circuit 506. Accordingly, the signal is routed through circuit 504 but not circuit 502. As a result, power that would otherwise be consumed by circuit 502 operating on the signal is saved and potentially erroneous operation due to both circuit 502 and 504 operating on the signal is prevented.

Additionally, dies 542 and 544 have a same design. As a result, in the illustrated embodiment, dies 542 and 544 are fabricated using a same mask. In some cases, it is cheaper to fabricate dies 542 and 544, as compared to dies fabricated using different masks. As illustrated by FIG. 6, in some embodiments, some portions of stacked die system 500 are fabricated subsequent to using the mask, such as bonding pad interface 510, bonding pad via 512, and bumps. Accordingly, in some embodiments, some of those portions of stacked die system 500 are not formed, such as the bonding pad via 512 of die 544 opposite circuit 502 from through silicon via 516. In other embodiments, as illustrated by FIG. 5, some or all of those portions are formed.

In various embodiments, additional layers are used. For example, in some embodiments, the signal is received at bump 530 via package layer 520. Further, in some embodiments, various circuits or portions of circuits are located elsewhere within dies 540, 542, and 544. For example, in some embodiments, some or all of circuits 502 and 504 are located within respective substrates 518 of dies 542 and 544.

Figure 7:
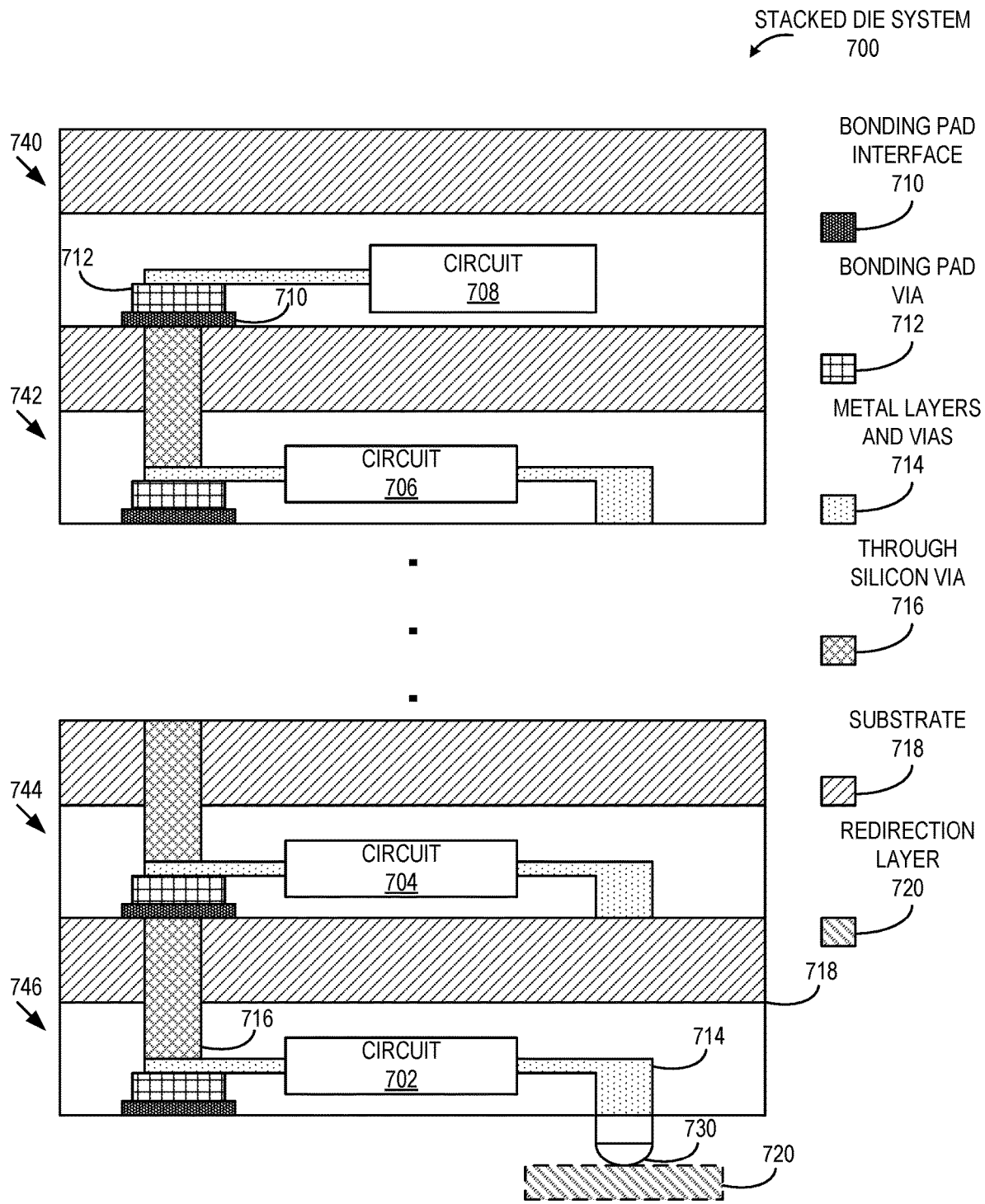
FIG. 7 is a block diagram of a fourth embodiment of a stacked die system in accordance with some embodiments.

FIG. 7 illustrates a front-to-back embodiment of a stacked die system 700 in accordance with at least some embodiments. Stacked die system 100 includes N dies including dies 740, 742, 744, and 746 where die 740 is stacked vertically over dies 742-746. As illustrated, dies 740-744 include some or all of the following layers: bonding pad interface 710, bonding pad via 712, metal layers and vias 714, through silicon via 716, and substrate 718. Substrates 718 are located at a side of dies 742 and 744 facing die 740, thus stacked die system 700 is a front-to-back embodiment. Further, die 740 includes circuit 708, die 742 includes circuit 706, die 744 includes circuit 704, and die 746 includes circuit 702. Additionally, stacked die system 700 includes bump 730, and in some embodiments, package layer 720. For clarity, other components such as some bumps, interposers, package substrates, diffusion regions, and active regions are not illustrated. In some embodiments, dies 740-746 are semiconductor dies. Additionally in some embodiments, dies 740-746 are to be coupled to a printed circuit board (PCB) or other carrier for implementation in an electronic device, including, for example, a portable electronic device such as a cellular phone, tablet computer, or notebook computer, a desktop computer, a server, and the like.

In the illustrated embodiment, stacked die system 700 functions similarly to stacked die system 100 of FIGS. 1 and 2. However, stacked die system 700 includes more dies than stacked die system 100. Similar to stacked die system 100, in the illustrated embodiment, although circuits 702-706 are designed to perform an operation for circuit 708, a single circuit of circuits 702-706 performs the operation. In the illustrated embodiment, circuit 702 performs an operation on a received signal and circuits 704 and 706 do not perform operations on the signal. In some embodiments, stacked die system 700 is implemented similarly to another stacked die system discussed herein, such as stacked die system 300 of FIGS. 3 and 4.

Figure 8:
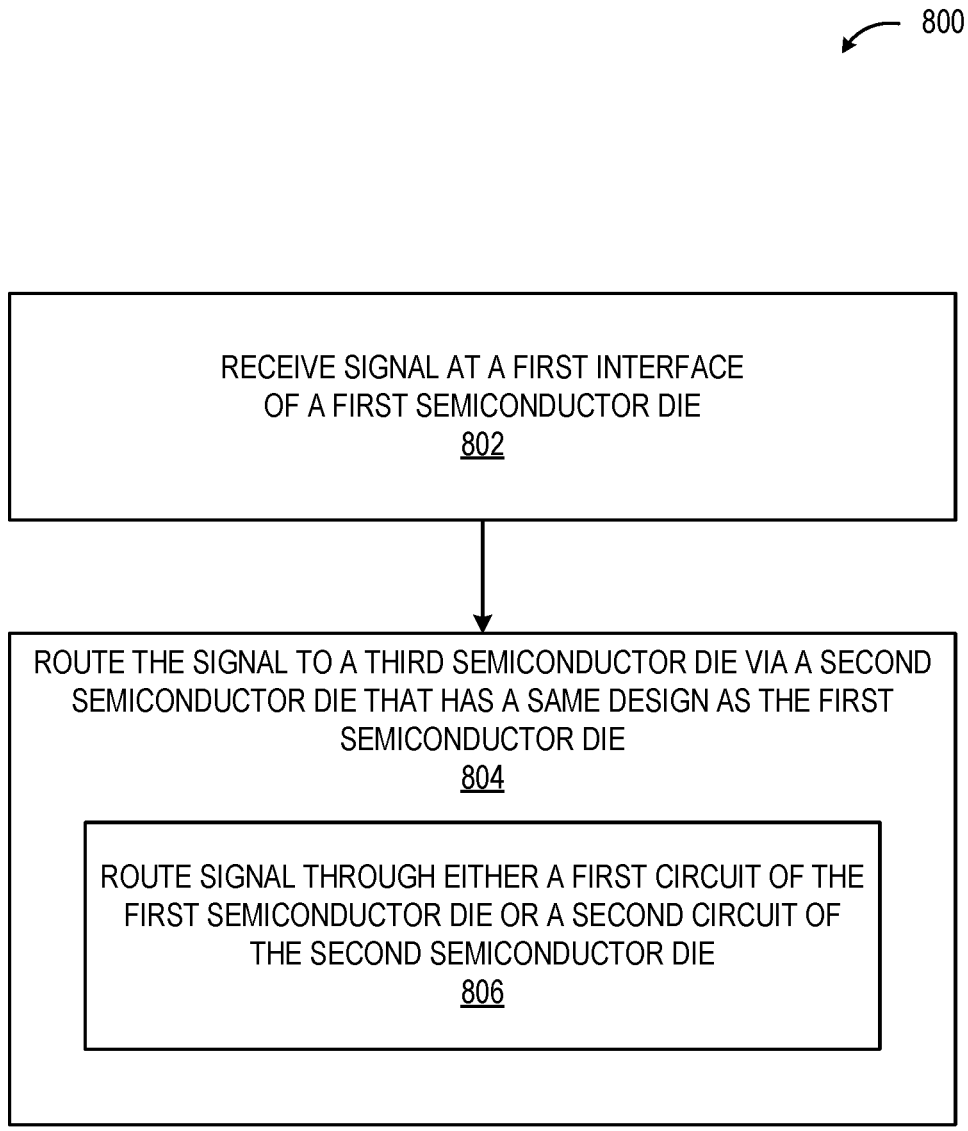
FIG. 8 is a flow diagram of a method of routing a signal within a stacked die system in accordance with some embodiments.

FIG. 8 is a flow diagram illustrating a method 800 of routing a signal within a stacked die system in accordance with some embodiments. In some embodiments, method 800 is initiated by one or more processors in response to one or more instructions stored by a computer readable storage medium.

At block 802, a signal is received at a first interface of a first semiconductor die. For example, a signal is received at bump 130 of die 144 of FIG. 1. At block 804, the signal is routed to a third semiconductor die via a second semiconductor die that has a same design as the first semiconductor die. For example, the signal is routed from die 144 to die 140 via die 142, where die 142 has a same design as die 144. At block 806, which is a portion of block 804, the signal is routed through either a first circuit of the first semiconductor die or a second circuit of the second semiconductor die. For example, the signal is routed through circuit 102 but not through circuit 104. Accordingly, a method of routing a signal is depicted.

Figure 9:
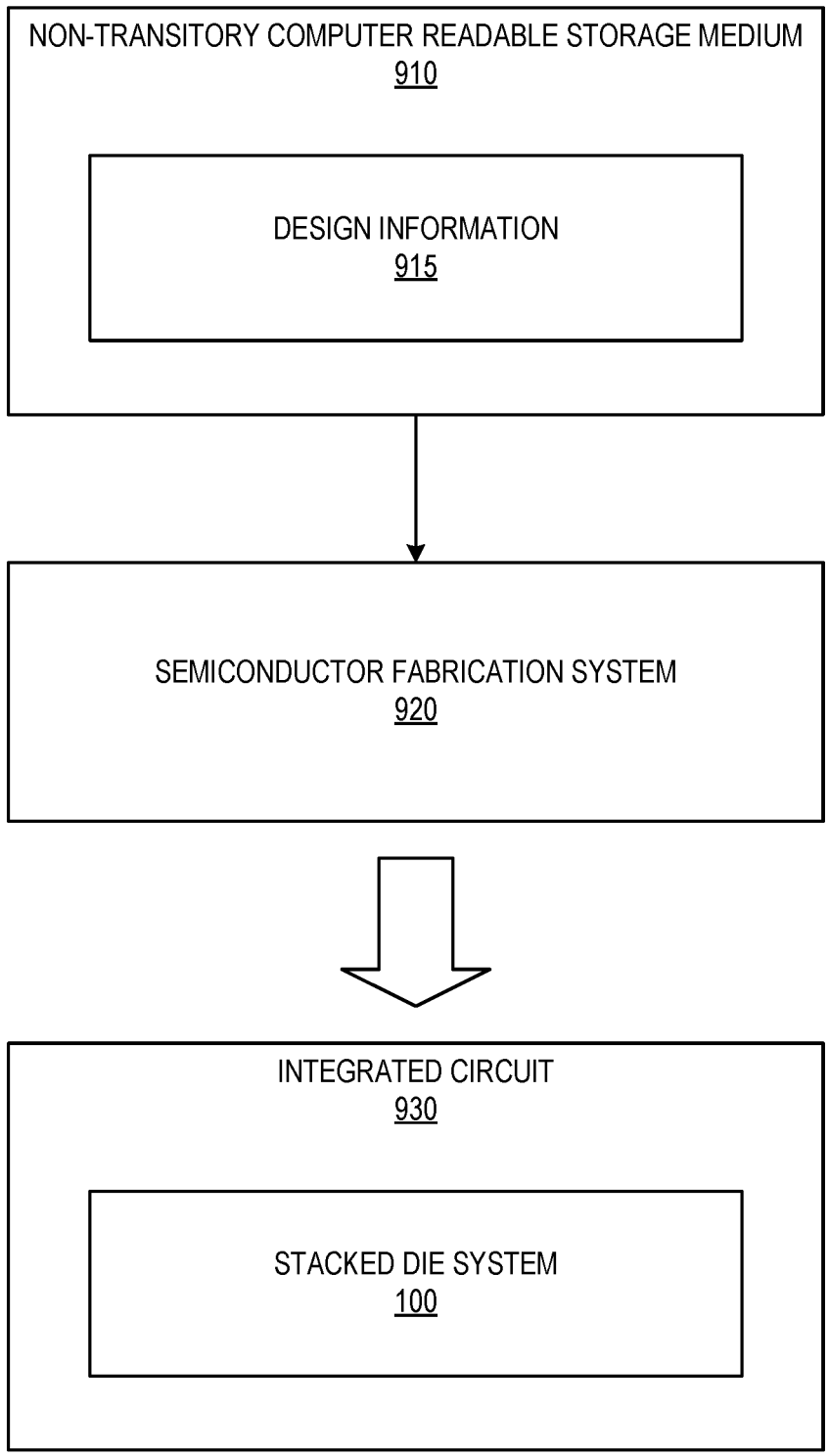
FIG. 9 is a block diagram of a process of fabricating at least a portion of an integrated circuit that includes a stacked die system in accordance with some embodiments.

FIG. 9 is a block diagram illustrating a fabrication process 900 for at least a portion of stacked die system. FIG. 9 includes a non-transitory computer readable storage medium 910 and a semiconductor fabrication system 920. Non-transitory computer readable storage medium 910 includes design information 915. FIG. 9 also illustrates a resulting fabricated integrated circuit 930. In the illustrated embodiment, integrated circuit 930 includes stacked die system 100 of FIG. 1. However, in other embodiments, integrated circuit 930 includes stacked die system 300 of FIG. 3, stacked die system 500 of FIG. 5, stacked die system 700 of FIG. 7, or another stacked die system consistent with the teachings described herein. In the illustrated embodiment, semiconductor fabrication system 920 processes design information 915 stored on non-transitory computer readable storage medium 910 and fabricates integrated circuit 930.

In various embodiments, non-transitory computer readable storage medium 910 includes any of various appropriate types of memory devices or storage devices. For example, in some cases, non-transitory computer readable storage medium 910 includes at least one of an installation medium (e.g., a CD-ROM, floppy disks, or tape device), a computer system memory or random access memory (e.g., DRAM, DDR RAM, SRAM, EDO RAM, Rambus RAM, etc.), a non-volatile memory such as a Flash, magnetic media (e.g., a hard drive, or optical storage), registers, or other types of non-transitory memory. In some embodiments, non-transitory computer readable storage medium 910 includes two or more memory mediums, which, in some cases, resides in different locations (e.g., in different computer systems that are connected over a network).

In some embodiments, design information 915 is specified using any of various appropriate computer languages, including hardware description languages such as, without limitation: VHDL, Verilog, SystemC, SystemVerilog, RHDL, M, MyHDL, etc. Design information 915 is usable by semiconductor fabrication system 920 to fabricate at least a portion of integrated circuit 930. The format of design information 915 is recognized by at least one semiconductor fabrication system 920. In some embodiments, design information 915 also includes one or more cell libraries, which specify the synthesis and/or layout of integrated circuit 930. In some embodiments, the design information is specified in whole or in part in the form of a netlist that specifies cell library elements and their connectivity. In various embodiments, design information 915, taken alone, does or does not include sufficient information for fabrication of a corresponding integrated circuit (e.g., integrated circuit 930). For example, in some cases, design information 915 specifies circuit elements to be fabricated but not their physical layout. In this case, design information 915 is combined with layout information to fabricate the specified integrated circuit.

In some embodiments, semiconductor fabrication system 920 includes any of various appropriate elements that fabricate integrated circuits. In various embodiments, these elements include, for example, elements for depositing semiconductor materials (e.g., on a wafer, including masking), removing materials, altering the shape of deposited materials, modifying materials (e.g., by doping materials or modifying dielectric constants using ultraviolet processing), etc. In some embodiments, semiconductor fabrication system 920 also performs various testing of fabricated circuits for correct operation.

In various embodiments, integrated circuit 930 operates according to a circuit design specified by design information 915, which, in some cases, includes performing any of the functionality described herein. For example, in some cases, integrated circuit 930 includes any of various elements described with reference to FIGS. 1-8. Further, in some embodiments, integrated circuit 930 performs various functions described herein in conjunction with other components. In some cases, the functionality described herein is performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

In some embodiments, a method of initiating fabrication of integrated circuit 930 is performed. Design information 915 is generated using one or more computer systems and stored in non-transitory computer readable storage medium 910. The method concludes when design information 915 is sent to semiconductor fabrication system 920 or prior to design information 915 being sent to semiconductor fabrication system 920. Accordingly, in some embodiments, the method does not include actions performed by semiconductor fabrication system 920. In various embodiments, design information 915 is sent to semiconductor fabrication system 920 in a variety of ways. For example, in some cases, design information 915 is transmitted (e.g., via a transmission medium such as the Internet) from non-transitory computer readable storage medium 910 to semiconductor fabrication system 920 (e.g., directly or indirectly). As another example, non-transitory computer readable storage medium 910 is sent to semiconductor fabrication system 920. In response to the method of initiating fabrication, semiconductor fabrication system 920 fabricates integrated circuit 930 as discussed above.

In some embodiments, the apparatus and techniques described above are implemented in a system including one or more integrated circuit (IC) devices (also referred to as integrated circuit packages or microchips), such as the stacked die systems described above with reference to FIGS. 1-8. In some embodiments, electronic design automation (EDA) and computer aided design (CAD) software tools are used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device is stored in and accessed from the same computer readable storage medium or a different computer readable storage medium.

In some embodiments, a computer readable storage medium includes any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. In some embodiments, the computer readable storage medium is embedded in the computing system (e.g., system RAM or ROM), fixedly attached to the computing system (e.g., a magnetic hard drive), removably attached to the computing system (e.g., an optical disc or Universal Serial Bus (USB)- based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. In some embodiments, the executable instructions stored on the non-transitory computer readable storage medium are in source code, assembly language code, object code, or other instruction format that is interpreted or otherwise executable by one or more processors.

Note that not all of the activities or elements described above in the general description are required, that a portion of a specific activity or device are not required, and that, in some cases, one or more further activities are performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that cause any benefit, advantage, or solution to occur or become more pronounced are not to be construed as a critical, required, or essential feature of any or all the claims. Moreover, the particular embodiments disclosed above are illustrative only, as the disclosed subject matter could be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above could be altered or modified and all such variations are considered within the scope of the disclosed subject matter. Accordingly, the protection sought herein is as set forth in the claims below.

Within this disclosure, in some cases, different entities (which are variously referred to as "components," "units," "devices," etc.) are described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "memory device configured to store data" is intended to cover, for example, an integrated circuit that has circuitry that stores data during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. Further, the term "configured to" is not intended to mean "configurable to." An unprogrammed field programmable gate array, for example, would not be considered to be "configured to" perform some specific function, although it could be "configurable to" perform that function after programming. Additionally, reciting in the appended claims that a structure is "configured to" perform one or more tasks is expressly intended not to be interpreted as having means-plus-function elements.

What is claimed is:

1. A system in package comprising:
a first die comprising a first set of one or more metal layers of a first circuit;
a second die stacked overlying the first die, wherein the second die comprises a second set of one or more metal layers of a second circuit, and wherein the second die has a same design as the first die, and wherein the second circuit corresponds to the first circuit; and
a third die stacked overlying the second die, wherein the first die and the second die are configured to send a signal from the first die to the third die via either the first circuit or the second circuit but not both.

2. The system in package of claim 1, wherein:
the signal is a voltage signal; and
the first circuit is a voltage regulation circuit configured to control a voltage supplied to at least one circuit of the third die.

3. The system in package of claim 1, wherein:
the signal is an information signal; and
the first circuit is a signal distribution circuit configured to perform a logical operation using the signal.

4. The system in package of claim 3, wherein:
the first circuit is an inverter configured to invert the signal.

5. The system in package of claim 1, wherein:
a substrate of the first die comprises the first circuit.

6. The system in package of claim 1, wherein:
a first substrate of the first die is located at a side of the first die facing towards the third die; and
a second substrate of the first die is located at a side of the second die facing towards the third die.

7. The system in package of claim 6, wherein:
the signal is sent to the third die via the first circuit and not via the second circuit.

8. The system in package of claim 1, wherein:
a first substrate of the first die is located at a side of the first die facing away from the third die; and
a second substrate of the first die is located at a side of the second die facing away from the third die.

9. The system in package of claim 1, wherein:
the signal is sent to the third die via the first circuit and not via the second circuit.

10. The system in package of claim 9, further comprising:
the signal is sent from the first circuit to a package layer, from the package layer back to the first die, and from the first die to the third die via the second die.

11. The system in package of claim 1, wherein:
the signal is sent to the third die via the second circuit and not via the first circuit.

12. The system in package of claim 1, further comprising:
a fourth die stacked vertically over the second die and under the third die, wherein the fourth die comprises a third set of one or more metal layers of a third circuit, and wherein the fourth die has the same design as the first die, and wherein the third circuit corresponds to the first circuit.

13. A method comprising:
receiving a signal at a first interface of a first semiconductor die of a stacked semiconductor device;
routing the signal to a third semiconductor die of the stacked semiconductor device via a second semiconductor die of the stacked semiconductor device, comprising sending the signal through a respective circuit of either the first semiconductor die or the second semiconductor die, but not both; and
wherein the first semiconductor die has a same design as the second semiconductor die.

14. The method of claim 13, wherein:
routing the signal to the third semiconductor die comprises routing the signal from the first semiconductor die to a package layer, wherein the first semiconductor die is located between the package layer and the third semiconductor die.

15. The method of claim 13, wherein:
sending the signal through a first circuit of the first semiconductor die comprises the first circuit regulating a voltage of the signal.

16. The method of claim 13, wherein:
sending the signal through a second circuit of the second semiconductor die comprises the second circuit performing a logical operation using the signal.

17. A non-transitory computer readable storage medium embodying a set of executable instructions, the set of executable instructions to manipulate a fabrication system to perform a portion of a process to fabricate at least part of a hardware integrated circuit, the hardware integrated circuit comprising:

a first semiconductor die comprising a first set of one or more metal layers of a first circuit;

a second semiconductor die stacked vertically over the first semiconductor die, wherein the second semiconductor die comprises a second set of one or more metal layers of a second circuit, and wherein the second semiconductor die has a same design as the first semiconductor die, and wherein the second circuit corresponds to the first circuit; and a third semiconductor die stacked vertically over the second semiconductor die, wherein the first semiconductor die and the second semiconductor die are configured to send a signal from the first semiconductor die to the third semiconductor die via either the first circuit or the second circuit but not both.

18. The non-transitory computer readable storage medium of claim 17, wherein:
the design of the first semiconductor die includes a plurality of indications of bonding pads configured to receive the signal and to send the signal to the second semiconductor die.

19. The non-transitory computer readable storage medium of claim 18, wherein:
the design of the first semiconductor die includes one or more indications of bumps configured to receive the signal and to send the signal to one or more of the bonding pads of the first semiconductor die.

20. The non-transitory computer readable storage medium of claim 18, wherein:
the first circuit is a voltage regulation circuit located within a substrate of the first semiconductor die.

* * * * *